United States Patent [19]

Kunimune et al.

[11] Patent Number: 5,442,024

[45] Date of Patent: Aug. 15, 1995

[54] PHOTOSENSITIVE POLYIMIDE PRECURSOR COMPOSITION

[75] Inventors: Kouichi Kunimune, Chiba; Hirotoshi Maeda, Kanagawa; Kouichi Katou, Kanagawa; Eiji Watanabe, Kanagawa, all of Japan

[73] Assignee: Chisso Corporation, Osaka, Japan

[21] Appl. No.: 233,693

[22] Filed: Apr. 26, 1994

[30] Foreign Application Priority Data

Apr. 26, 1993 [JP] Japan .................. 5-099576

[51] Int. Cl.$^6$ .................................. C08G 77/08
[52] U.S. Cl. .................................. 528/12; 528/26; 528/38; 522/148; 522/172
[58] Field of Search ............... 528/38, 26, 12; 522/148, 172

[56] References Cited

U.S. PATENT DOCUMENTS

| | | | |
|---|---|---|---|
| 4,562,119 | 12/1985 | Darms et al. | 428/458 |
| 4,758,476 | 7/1988 | Sekine et al. | 428/473.5 |
| 4,818,806 | 4/1989 | Kunimune et al. | 528/26 |
| 4,927,736 | 5/1990 | Mueller et al. | 430/275 |
| 4,942,108 | 7/1990 | Moreau et al. | 430/169 |
| 5,053,314 | 10/1991 | Yamaoka et al. | 430/270 |

FOREIGN PATENT DOCUMENTS

| | | |
|---|---|---|
| 54-145794 | 11/1979 | Japan . |
| 2-144539 | 6/1990 | Japan . |
| 3763 | 1/1991 | Japan . |
| 4-120171 | 4/1992 | Japan . |

*Primary Examiner*—John C. Bleutge
*Assistant Examiner*—Margaret W. Glass
*Attorney, Agent, or Firm*—Leydig, Voit & Mayer

[57] ABSTRACT

A photosensitive polyimide precursor composition of the present invention comprises a polyimide precursor represented by the formula (6)

$$(OR^5)_k R^4{}_{3-k} Si{-}R^3{-}X{-}Z \qquad (6)$$

and having a logarithmic viscosity number of 0.1 to 5.0 dl/g measured in N-methyl-2-pyrrolidone at 30° C. and a compound capable of generating an acid by light irradiation, said polyimide precursor being obtained by reacting A mol of a tetracarboxylic dianhydride, B mol of a diamine, and C mol of an aminosilane so as to meet the relations of the equations:

$$1 \leq \frac{C}{A-B} \leq 2.5$$

$$0.1 \leq \frac{C}{B+C} \leq 1.$$

This composition not only has practical photosensitivity but also inhibits the reduction of film thickness due to curing and development, and it is also excellent in shelf stability in varnish and adhesive properties to a substrate such as a silicon wafer or the like.

2 Claims, No Drawings

PHOTOSENSITIVE POLYIMIDE PRECURSOR COMPOSITION

BACKGROUND OF THE INVENTION (i) Field of the Invention

The present invention relates to a photosensitive polyimide precursor composition. More specifically, it relates to a photosensitive polyimide precursor composition which has little volume shrinkage at the time of curing and which is excellent in adhesion to substrates and shelf stability.

(ii) Description of the Related Art

As heat-resistant photosensitive materials, photosensitive polyimides have been widely used to form insulating films and passivation films for semiconductors. Most of the photosensitive polyimides are mixtures of compounds having polymerizable carbon-carbon double bonds and polyimide precursors, and products of the compounds and the precursors obtained by a chemical bond such as an ester bond. For example, such photosensitive polyimides are known from Japanese Patent Laid-open Nos. (Sho) 54-145794 and (Hei) 2-144539, and Japanese Patent Publication No.(Sho) 55-41422. However, in order to practically carry out a pattern treatment, it is necessary to introduce a large amount, e.g., 50% or more of a compound having a carbon-carbon double bond to the polyimide precursor, and therefore the deterioration of resolving properties and large volume shrinkage at the time of curing cannot be avoided. On the other hand, to avoid such a problem a method has also been suggested in which a compound capable of generating an acid by light irradiation is utilized without using the compound having the carbon-carbon double bond. For example, the compound capable of generating an acid by light irradiation is blended with a polyimide having an acyloxy group in Japanese Patent Laid-open No. (Hei) 3-763, or a polyamic acid derivative having an organic group introduced by an ester bond in Japanese Patent Laid-open No. (Hei) 4-120171, whereby the pattern treatment is possible. In the former, however, the volume shrinkage can be controlled, but the adhesion to substrates is inferior. In the latter, the resolution is excellent, but the preparation of the polyamic acid derivative is inconveniently intricate.

SUMMARY OF THE INVENTION

An object of the present invention is to provide a photosensitive polyimide precursor composition which is easy to manufacture, provides good resolution and little volume shrinkage, and is excellent in adhesion to substrates.

The present inventors have intensively researched to solve the above-mentioned problems of conventional techniques. As a result, they have found that the above-mentioned various problems can be solved by a combination of a specific polyimide precursor having an alkoxysilane group at its molecular terminal and a compound capable of generation an acid by light irradiation, and in consequence, a photosensitive polyimide precursor composition of the present invention has now been completed.

That is, a photosensitive polyimide precursor composition of the present invention comprises a polyimide precursor represented by the formula (6)

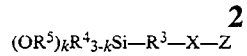 (6)

and having a logarithmic viscosity number of 0.1 to 5.0 dl/g measured in N-methyl-2-pyrrolidone at 30° C. and a compound capable of generating an acid by light irradiation, the aforesaid polyimide precursor being obtained by reacting A mol of a tetracarboxylic dianhydride represented by the formula (1)

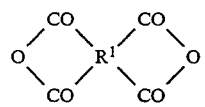 (1)

B mol of a diamine represented by the formula (2)

$NH_2-R^2-NH_2$ (3)

and C mol of an aminosilane represented by the formula (3)

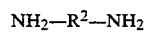 (3)

so as to meet the relations of the equations (4) and (5)

$$1 \leq \frac{C}{A-B} \leq 2.5 \quad (4)$$

$$0.1 \leq \frac{C}{B+C} \leq 1 \quad (5)$$

wherein X is a polymer chain comprising m mol of a structural unit represented by the formula (6)

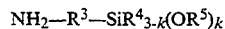 (6-1)

and n mol of a structural unit represented by the formula (6-2)

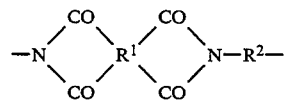 (6-2)

and meeting the relation of the equation (7)

$$40 \leq 100 \times \frac{m}{m+n} \leq 100 \quad (7)$$

Z is a group represented by the formula (8), (9), (10), 11), (12) or (13);

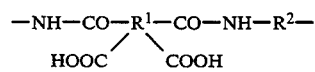 (8)

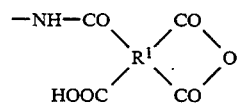 (9)

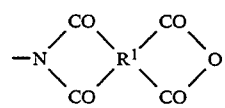 (10)

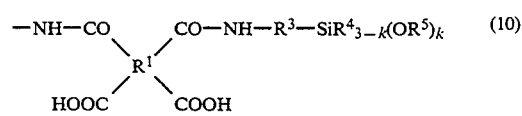

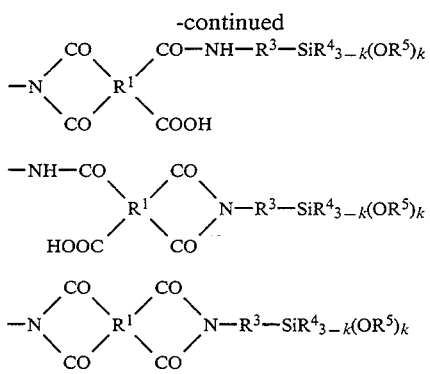

wherein $R^1$ is independently a tetravalent carbocyclis aromatic group, heterocyclic group, alicyclic group or aliphatic group having 4 to 30 carbon atoms; $R^2$ is independently a divalent aliphatic group, alicyclic group, aromatic aliphatic group, carbocyclic aromatic group or heterocyclic group having 2 to 30 carbon atoms, or a polysiloxane group represented by the formula (14)

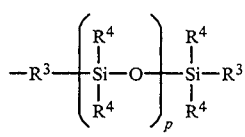

wherein p is a value of 1 to 100; $R^3$ is independently a group represented by the formula (15), (16), (17), or (18)

 (15)

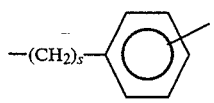 (16)

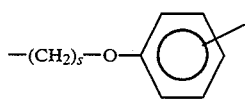 (17)

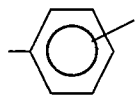 (18)

wherein s is an integer of 1 to 4; $R^4$ is independently an alkyl group having 1 to 6 carbon atoms, phenyl group or alkyl-substitued phenyl group having 7 to 12 carbon atoms; $R^5$ is independently an alkyl group having 1 to 6 carbon atoms and k is an integer of 1 to 3.

DETAILED DESCRIPTION OF PREFERRED EMBODIMENTS

A photosensitive polyimide precursor composition of the present invention is a composition comprising a polyimide precursor having an alkoxysilane terminal represented by the formula (6) and a compound capable of generating an acid by light irradiation.

The polyimide precursor represented by the formula (6) which can be used in the composition of the present invention can be obtained by reacting A mol of a tetracarboxylic dianhydride represented by the formula (1), B mol of a diamine represented by the formula (2), and C mol of an aminosilane represented by the formula (3) so as to meet the relationship of the equations (4) and (5):

$$1 \leq \frac{C}{A - B} \leq 2.5 \quad (4)$$

$$0.1 \leq \frac{C}{B + C} \leq 1 \quad (5)$$

As typical methods for the reaction meeting the above-mentioned relations, there are a method which comprises imidizing a polyamic acid having an alkoxysilane terminal in a usual manner, and a method which comprises imidizing a polyamic acid obtained by reacting a tetracarboxylic dianhydride with a diamine, and then reacting the resulting imide with the an aminosilane represented by the formula (3).

That is, with regard to the first method for obtaining the polyimide precursor which can be used in the composition of the present invention, in the first place, A mol of the tetracarboxylic dianhydride, B mol of the diamine and C mol of the aminosilane are mixed in a solvent at room temperature in a range meeting the relationship of the equations (4) and (5) to obtain the polyamic acid having the alkoxysilane terminal. Next, to this polyamic acid are added a dehydrating agent such as acetic anhydride, dicyclohexylcarbodiimide, N-ethoxycarbonyl-2-ethoxy-1, 2-dihydroquinoline or the like, and a tertiary amine such as pyridine, isoquinoline, 1-benzyl-2-methylimidazole or the like, and a known imidization reaction is carried out at room temperature to obtain the polyimide precursor having the alkoxysilane terminal represented by the formula (6).

With regard to the second method for obtaining the polyimide precursor, the tetracarboxylic dianhydride is reacted with the diamine in a solvent to synthesize the polyamic acid, and imidization is then carried out in the above-mentioned manner, or this amic acid solution is heated up to a temperature of 100° to 200° C. as it is, to perform the imidization, followed by reaction with the aminosilane, to obtain the polyimide precursor having the alkoxysilane terminal represented by the formula (6).

With regard to the third method for obtaining the polyimide precursor, the tetracarboxylic dianhydride is reacted with the diamine in a solvent to synthesize the polyamic acid, and the thus synthesized polyamic acid is then mixed with a poor solvent to precipitate the polyamic acid. Next, the separated polyamic acid is imidized at 100° to 300° C. (e.g., by the use of a heating means such as an oven), followed by reaction with the aminosilane similarly, to obtain the desired polyimide precursor having the alkoxysilane terminal represented by the formula (6).

The mixing ratio of the tetracarboxylic dianhydride, the diamine and the aminosilane, which are the raw materials, is required to be maintained in the ranges of the equations (4) and (5). If the mixing ratio deviates from the range of the equation (4), the viscosity of the obtained polyimide precursor having the alkoxysilane terminal noticeably changes with time, and so its shelf stability is poor. If a value of C/(B+C) in the equation (5) is less than 0.1, sufficient sensitivity (photosensitivity) cannot be obtained, and adhesion to substrates is also poor.

From the viewpoint of film formation, the polyimide precursor having the alkoxysilane terminal represented by the formula (6) preferably has a logarithmic viscosity number in the range of 0.1 to 5.0 dl/g. Here, the logarithmic viscosity number can be defined as $\eta_{inh}$ represented by the equation (a)

$$\eta_{inh} = \frac{\ln(\eta/\eta_o)}{C} \quad \text{(a)}$$

wherein $\eta$ is a viscosity of a solution measured at a temperature of $30\pm0.01°$ C. at a concentration of 0.5 g/dl by the use of Ubbelohde's viscometer; $\eta_o$ is a viscosity of the solution measured at the same temperature by the use of the viscometer; and C is the concentration, i.e., 0.5 g/dl.

The polyimide precursor represented by the formula (6) which can be used in the composition of the present invention preferably has an imidization ratio of 40 to 100%. The moiety $100\times m/(m+n)$ of the formula (7) denotes the imidization ratio, and this imidization ratio is preferably 40% or more. If it is less than 40%, the polyimide precursor having the alkoxysilane terminal is poor in shelf stability.

Typical examples of the tetracarboxylic dianhydride represented by the formula (1) which can be used in the composition of the present invention include the following known compounds, but they are not always limited to these compounds.

Aromatic tetracarboxylic dianhydrides such as pyromellitic dianhydride, 3,3',4,4'-biphenyltetracarboxylic dianhydride, 2,2',3,3'-biphenyltetracaroxylic dianhydride 2,3,3',4'-biphenyltetracarboxylic dianhydride, 3,3',4,4'-benzophenonetetracarboxylic dianhydride, 2,2', 3,3'-benzophenonetetracarboxylic dianhydride, 2,3,3',4'-benzophenonetetracarboxylic dianhydride, bis-(3,4-dicarboxyphenyl) ether dianhydride, bis-(3,4-dicarboxyphenyl) sulfone dianhydride, 1,2,5,6-naphthalenetetracarboxylic dianhydride, 2,3,6,7-naphthalenetetracarboxylic dianhydride, 2,2-bis-(3,4-dicarboxyphenyl)hexafluoropropane dianhydride and the like; alicyclic tetracarboxylic dianhydride, such as cyclobutanetetracarboxylic dianhydride, methylcyclobutanetetracarboxylic dianhydride and the like; and aliphatic tetrcarboxylic dianhydrides such as 1,2,3,4,-tetracarboxybutane dianhydride and the like.

Typical examples of the diamine represented by the formula (2) which can be used in the composition of the present invention include the following compounds, but they are not always limited to these compounds.

Aromatic diamines such as 4,4'-diaminodiphenyl ether, 3,4'-diaminodiphenyl ether, 4,4'-diaminodiphenylmethane, 4,4'-diaminodiphenyl sulfone, 4,4'-diaminodiphenyl sulfide, 4,4'-di(m-aminophenoxy)diphenyl sulfone, 4,4'-di(p-aminophenoxy)diphenyl sulfone, orthophenylenediamine, methaphenylenediamine, p-phenylenediamine, benzidine, 3,3'-diaminobenzophenone, 4,4'-diaminobenzophenone, 4,4'-diaminodiphenyl-2,2-propane, 1,5-diaminonaphthalene, 1,8-diaminonaphthalene, 4,4'-bis(4-aminophenoxy)biphenyl, 2,2-bis{4-(4-aminophenoxy)phenyl}hexafluoropropane, 1,4-bis(4-aminophenoxy)benzene, 1,3-bis(4-aminophenoxy)benzene, 4,4'-diamino-3,3'-diethyl-5,5'-dimethyldiphenylmethane, 4,4'-diamino-3,3',5,5'-tetramethyldiphenylmethane, 1,4-diaminotoluene, methaxylylenediamine, 2,2'-dimethylbenzidine and the like; aliphatic diamines such as trimethylenediamine, tetramethylenediamine, hexamethylenediamine, 2,11-dodecanediamine and the like; silicon-based diamines such as bis(p-aminophenoxy)dimethylsilane, 1,4-bis(3-aminopropyldimethylsilyl)benzene and the like; alicyclic diamines such as 1,4-diaminocyclohexane, bis(4-aminocyclohexyl)-methane, isophoronediamine and the like; and guanamines such as acetoguanamine, benzoguanamine and the like.

As the diamine, a diaminopolysiloxane can be used, and examples include compounds represented by the following formulae:

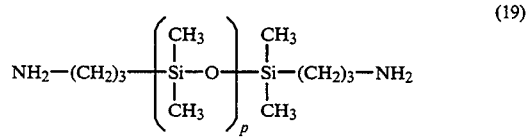
(19)

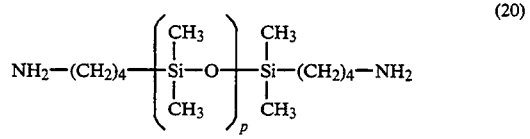
(20)

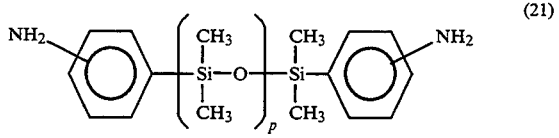
(21)

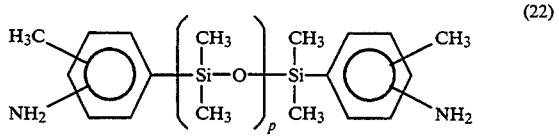
(22)

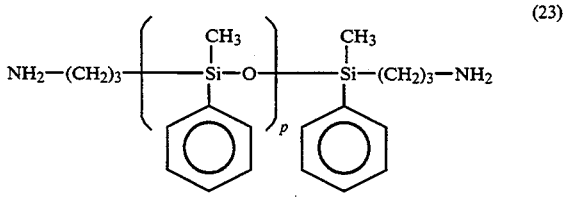
(23)

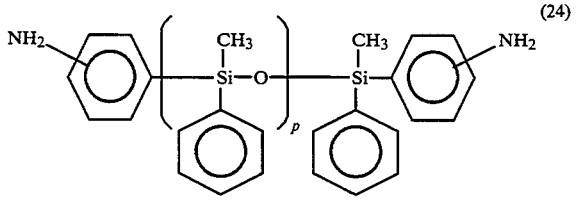
(24)

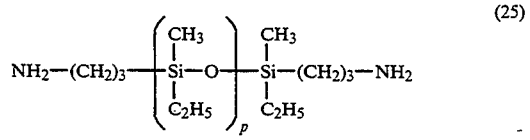
(25)

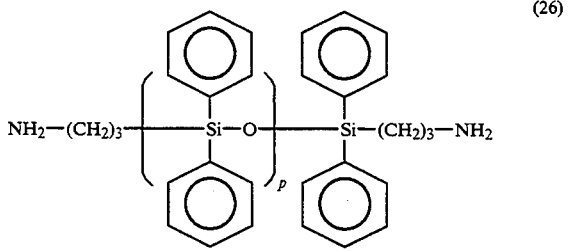
(26)

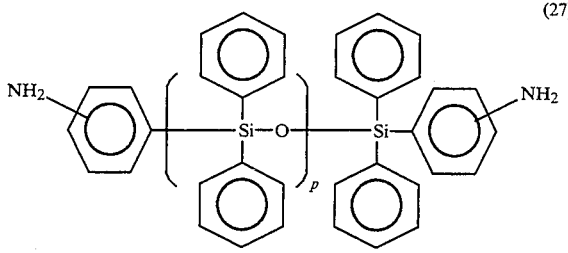

(27)

wherein p is in the range of from 1 to 100. Typical examples of the aminosilane represented by the formula (3) which can be used in the composition of the present invention include the following known compounds, but they are not always limited to these compounds:

Aminomethyl-di-n-propoxy-methylsilane, (β-aminoethyl)-di-n-propoxy-methylsilane, (β-aminoethyl)-diethoxy-phenylsilane, (β-aminoethyl)-tri-n-propoxysilane, (β-aminoethyl)-dimethoxy-methylsilane, (γ-aminopropyl)-dipropoxy-methylsilane, (γ-aminopropyl)-di-n-butoxy-methylsilane, (γ-aminopropyl)-triethoxysilane, (γ-aminopropyl)-di-n-pentoxy-phenylsilane, (γ-aminopropyl)-methoxy-n-propoxysilane, (δ-aminobutyl)-dimethoxy-methylsilane, (3-aminophenyl)-tri-n-propoxysilane, (4-aminophenyl)-tri-n-propoxysilane, {β-(4-aminophenyl)ethyl}-diethoxy-methylsilane, {β-(3-aminophenyl)ethyl}-di-n-propoxy-phenylsilane, {γ-(4-aminophenyl)propyl}-di-n-propoxy-methylsilane, {γ-(4-aminophenoxy)propyl}propoxy-methylsilane, {γ-(3-aminophenoxy)propyl}-di-n-butoxy-methylsilane, {γ-(3-aminiphenoxy)}-dimethyl-methoxysilane, {γ-aminoproply)-methyl-diethoxysilne, {γ-aminopropyl)-ethyl-di-n-propoxysilane, (4-aminophenyl)-trimethoxysilane, (3-aminophenyl)-trimethoxysilane, (4-aminophenyl)-methyl-dimethoxysilane, (3-aminiphenyl)-dimethyl-methoxysilane, (4-aminophenyl)-trimethoxysilane, and {3-(triethoxysilyl)propyl}urea.

As the preferable solvent for use in the reaction for obtaining the polyimide precursor in the composition of the present invention, or as the preferable solvent for use in the preparation of the photosensitive polyimide precursor composition of the present invention, the following compounds are included as examples:

N-methyl-2-pyrrolidone, N,N-dimethylacetamide, N,N-dimethylformamide, dimethyl sulfoxide, tetramethylurea, pyridine, hexamethylsulfoneamide, methylformamide, N-acetyl-2-pyrrolidone, 2-methoxyethanol, 2-ethoxyethanol, 2-butoxyethanol, diethylene glycol monomethyl ether, diethylene glycol monoethyl ether, diethylene glycol monobutyl ether, cyclopentanone, methylcyclopentanone, cyclohexanone, cresol, γ-butyrolactone, isophorone, N,N-diethylacetamide, N,N-diethylformamide, N,N-dimethylmethoxyacetamide, tetrahydrofuran, N-methyl-ε-caprolactam and tetrahydrothiophene dioxide (sulpholane).

Furthermore, the above-mentioned organic solvents could be used diluted with another non-protonic (neutral) organic solvent such as an aromatic, an alicyclic, a chain aliphatic hydrocarbon, or its chlorinated derivative (e.g., benzene, toluene, xylene, cyclohexane, pentane, hexane, petroleum ether, methylene chloride or the like), dioxane or the like.

Examples of the compound capable of generating an acid by light irradiation (hereinafter referred to simply as "photoacid generator" sometimes) which can be used in the present invention include many known compounds, for example, various onium salts such as ammonium salts, diazonium salts, iodine salts, sulfonium salts, selenium salts, arsenic salts and the like; organic halogen compounds such as phenyltrihalomethylsulfone compounds, halomethyltriazine compounds, halomethyloxadiazole compounds and the like; esters and amide compounds of 1,2-naphthoquinonediazido-4-sulfonic acid, sulfonic acid ester compounds of nitrobenzyl alcohol, sulfonic acid ester compounds of oximes, sulfonic acid ester compounds of N-hydroxyamides and N-hydroxyimides, β-ketosulfonebased compounds, mixtures thereof, and the like. These compounds are not restrictive.

Names of typical examples of the photoacid generators are as follows:

Di(p-t-butylphenyl)diphenyliodonium trifluoromethanesulfonate, diphenyliodonium tetrafluoroborate, diphenyliodonium hexafluorophosphate, diphenyliodonium trifluoromethanesulfonate, benzenediazonium paratoluenesulfonate, 4-p-tolyl-mercapto-2,5-diethoxybenzenediazonium hexafluorophosphate, diphenylamine-4-diazonium sulfate, tri(t-butylphenyl)sulfonium trifluoromethanesulfonate triphenylsulfonium trifluoromethanesulfonate, triphenylselenium tetrafluoroborate, orthonitrobenzyl p-toluenesulfonate, benzoin tosylate, benzoin methanesulfonate, benzoin trifluoromethanesulfonate, benzoin-2-trifluoromethane benzenesulfonate, anisoin tosylate, anisoin methanesulfonate, anisoin trifluoromethanesulfonate, anisoin-2-trifluoromethane benzenesulfonate, 1-benzoyl-1-methylsulfonyloxycyclohexane, 2-{(p-tolylsulfonyl)oxy}-1-phenyl-1-octanone, 2-{(β-naphthylsulfonyl)oxy}-1-phenyl-1-propanone, 2-{(p-acetamidophenyl-sulfonyl)oxy}-1-phenyl-1-propanone, benzoic acid amide tosylate, benzoic acid amide methanesulfonate, N-tosyloxyphthalimide, N-{(2-trifluoromethanebenzenesulfonyl)oxy}phthalimde, N-tosyloxy-1,8-naphthalimide, N-{(2-trifluoromethanebenzenesulfonyl)oxy}-1,8-naphthalimide, N-tosyloxy-2,3-diphenylmaleimide, N-{(2-trifluoromethanebenzenesulfonyl)oxy-2,3-diphenylmaleimide, 4-di-n-propylamino)-benzonium tetrafluoroborate, 4-methyl-6-trichloromethyl-2-pyrone, 4-(3,4,5-trimethoxystyryl)-6-trichloromethyl-2-pyrone, 4-(4-methoxystyryl)-6-(3,3,3-trichloropropenyl)-2-pyrone, 2-trichloromethyl-benzimidazole, 2-tribromomethyl-quinone, 2,4dimethyl-1-tribromoacetyl-benzene, 4-dibromoacetyl-benzoic acid, 1,4-bis-dibromomethyl-benzene, tris-dibromomethyl-s-triazine, 2-(6-methoxynaphthyl-2-yl)-4,6-bis-trichloromethyl-s-triazine, 2-(naphthyl-1-yl)-4,6-bis-trichloromethyl-s-triazine, 2-(naphtyl-2-yl)-4,6-bis-trichloromethyl-s-triazine, 2-(4-ethoxy-naphthyl-1-yl)-4,6-bis-trichloromethyl-s-triazine, 2-(benzopyranyl-3-yl)-4,6-bis-trichloromethyl-s-triazine, 2-(4-methoxy-anthracene-1-yl)-4,6-bis-trichloromethyl-s-triazine, 2-(phenethyl-9-yl)-4,6-bis-trichloromethyl-s-triazine, o-naphthoquinonediazido-5-sulfonic acid ester, 2-phenyl-5-trichloromethyloxadiazole, 2-(p-methozyphenyl)-5-trichloromethylozadiazole, 2-styryl-5-trichloromethyloxadiazole, 2-(n-butyl)-5-trichloromethyloxadiazole, α-trifluoroacetophenoneoxime-4-hydroxy benzenesulfonate, 9(4-hydroxybenzenesulfonyloxyimino)-fluorene, 9-(4-methacrylamido-methylbenzenesulfonyloxyimino)-fluorene, 2-(4-methoxystyryl)-4,6bis-(trichlomethyl)-s-triazine, (4-methoxyphenyl)phenyliodonium triifluoromethanesulfonate,N-{methanesulfonyl)oxy}-2,3-diphenylmaleimide and the like.

The amount of the compound capable of generating an acid by light irradiation is in the range of 0.01 to 30 parts by weight, preferably 0.5 to 15 parts by weight based on 100 parts by weight of the polyimide precursor having the alkoxysilane terminal and represented by the formula (6). If this amount is less than 0.01 part by weight, the sensitivity is low, and if it is more than 30 parts by weight, the film quality of a cured polyimide deteriorates.

Furthermore, if necessary, in addition to the solvent, additives such as a sensitizing agent, a dye, a pigment and a surface active agent and the like can be added to the photosensitive polyimide precursor composition of the present invention.

The photosensitive polyimide precursor composition of the present invention is usually utilized in the state of a solution. The photosensitive composition is applied to a substrate, and most of the solvent is then volatilized. Afterward, light irradiation is carried out to generate an acid, and the thus generated acid functions a catalyst, so that condensation reaction proceeds between the alkoxysilanes present at the terminals of the polymer. As a result, the portion which has been irradiated with the light becomes a patterned polyimide precursor insoluble in solvents, so that a difference of solubility takes place between the irradiated portion and the unirradiated portion. By the utilization of this difference, development can be carried out.

The thus obtained patterned polyimide precursor is then heated, thereby completing the imidization reaction and the condensation reaction of the alkoxysilane. Since the polyimide precursor which can be used in the composition of the present invention has the alkoxysilane group at the molecular terminal, the precursor is excellent in adhesion to the substrate and can hold the sufficient sensitivity only by adding a small amount of the compound capable of generating an acid by light irradiation. Therefore, further addition of a photosensitive composition such as an acrylic compound is unnecessary, and hence the volume shrinkage of the precursor at the time of curing can be minimized.

Next, reference will be made to a process for forming a patterned silicon-containing polyimide film by the use of the photosensitive polyimide precursor composition of the present invention.

The photosensitive polyimide precursor composition of the present invention is applied to a substrate such as silicon wafer, a metal plate, a plastic plate, a glass plate or the like in a known manner such as spin coating, immersion, printing, dispensing, roll coating or the like. The formed coating film is pre-baked at a temperature of 30° to 150° C. preferably 60 ° to 120° C. for a period of several minutes to several tens of minutes by the use of a heating means such as an electric furnace, a hot plate, an infrared heater or the like to remove most of the solvent in the coating film, and the film is then irradiated with actinic radiation through a negative mask.

Examples of the actinic radiation include X-rays, electron rays, ultraviolet rays and visible light, and above all, the ultraviolet rays and the electron rays are desirable. Successively, heating is given at 30° to 200° C. preferably 60° to 180° C. for 30 seconds to 15 minutes by the above-mentioned heating means (post exposure baking), if necessary, whereby the condensation reaction of alkoxysilanes at the terminals of the polymer is accelerated by an acid generated by the light irradiation.

Next, the unirradiated portion is removed by dissolving in a developing solution to obtain a relief pattern. Examples of the developing solution which can be used herein include organic solvents enumerated above as the examples of the solvent for the reaction, and mixtures of these solvents with a poor solvent such as ethyl alcohol, xylene, water or the like.

In addition to the above-mentioned organic solvents, other examples of the developing solution include aqueous solutions of inorganic alkalis such as sodium hydroxide, potassium hydroxide, sodium carbonate, sodium silicate, sodium metasilicate, ammonia and the like, aqueous solutions of organic amines such as ethylamine, n-propylamine, diethylamine, di-n-propylamine, triethylamine, methyldiethylamine, monoethanolamine, diethanolamine, triethanolamine, tetramethylammonium hydroxide, trimethylhydroxyethylammoinum hydroxide, and the like. In a certain case, solutions formed by mixing these aqueous solutions with alcohols can also be used.

If necessary, the coating film is then rinsed with a poor solvent such as ethyl alcohol, water or the like, and then dried at a temperature of 150° C. or less.

The coating film having the relief pattern which has been formed by the development is the precursor of the polyimide. Thus, the film is then heated at a temperature of 200° to 500° C. for a period of several minutes to several hours, preferably at 300° to 400° C. for 0.5 to 3 hours by the above-mentioned heating means to be converted into an imide, whereby the alkoxysilanes are condensed to form a siloxane bond to form a patterned silicon-containing polyimide film.

Alternatively, in any step of the irradiation with the actinic radiation, development, rinsing and drying after the pre-baking step, the film can be peeled from the substrate, subjected to the subsequent treatments, and then used as the single patterned film.

The photosensitive polyimide precursor composition of the present invention can be applied to electronics-related materials, particularly, various kinds of protective films, leveling films, passivation films and buffer coating films for semiconductor elements, α-ray shield films for LSI memories, interlayer dielectric films, interlayer films of multi-layer boards for printed-wiring boards, aligning films for liquid crystals, insulation materials for thermal heads, and the like.

EXAMPLES

Next, the present invention will be described in more detail with reference to synthetic examples and examples, but the scope of the present invention should not be limited at all by these synthetic examples and examples.

Synthetic Example 1

(Synthesis of a polyimide precursor)-

A one-liter flask equipped with a stirrer, a dropping funnel, a thermometer, a condenser and a nitrogen purging device was installed in a thermostatic chamber. 500 g of dehydrated and purified N-methyl-2-pyrrolidone (hereinafter abbreviated to "NMP"), 50.71 g (0.158 mol) of 3,3',4,4'-benzophenonetetracarboxylic dianhydride (hereinafter abbreviated to "BTDA"), 15.75 g (0.079 mol) of bis(4-aminophenyl) ether and 33.54 g (0.157 mol) of 4-aminophenyl-trimethoxysilane (hereinafter abbreviated to "APMS") were added to the flask, and reaction was then carried out at 20° to 30° C. for 10 hours to synthesize a polyamic acid solution.

Next, 74.15 g of N-ethoxycarbonyl-2-ethoxy-1,2-dihydroquinoline (hereinafter abbreviated to "EEDQ") and 15 g of isoquinoline were added to this solution, and reaction was then carried out at 50° C. for 10 hours. Furthermore, a large amount of ethanol was added to this solution, followed by stirring to precipitate a polymer. The thus precipitated polymer was collected by filtration, and then dried at 30° C. overnight under reduced pressure to obtain a polyimide precursor. According to measurement by an infrared absorption spectrum method, the imidization ratio of this polymer was 82%, and the logarithmic viscosity number of the polymer in NMP at 30° C. was 0.26 dl/g.

Synthetic Example 2

The same equipment and procedure as in Synthetic Example 1 were used except that 500 g of N,N-dimethylacetamide was mixed with 42.24 (0.136 mol) of 4,4'-oxydiphthalic dianhydride, 49.05 g (0.113 mol) of bis(3-aminophenoxyphenyl)sulfone and 8.71 g (0.041 mol) of APMS, to obtain a polyamic acid solution.

Next, 50.39 g of EEDQ and 15 g of isoquinoline were added to the obtained solution, and the same procedure as in Synthetic Example 1 was then carried out to obtain a polyimide precursor having an imidization ratio of 67% and a logarithmic viscosity number of 0.69 dl/g.

Synthetic Example 3

The same equipment and procedure as in Synthetic Example 1 were used except that 500 g of NMP was mixed with 46.60 g (0.105 mol) of hexafluoroisopropylidene-2,2-bis(phthalicanhydride) (hereinafter abbreviated to "6FDA"), 48.93 g (0.094 mol) of 2,2-bis{4-(4-aminophenoxyphenyl)hexafluoropropane and 4.47 g (0.021 mol) of APMS, to obtain a polyamic acid solution.

Next, 52.00 g of EEDQ and 15 g of isoquinoline were added to the obtained solution, and the same procedure as in Synthetic Example 1 was then carried out to obtain a polyimide precursor having an imidization ratio of 94% and a logarithmic viscosity number of 1.3 dl/g.

Synthetic Example 4

The same equipment and procedure as in Synthetic Example 1 were used except that 500 g of NMP was mixed with 53.09 g (0,120 mol) of 6FDA, 35.20 g (0.096 mol) of 4,4'-bis(4-aminophenoxy)biphenyl and 11.72 g (0.055 mol) of APMS, to obtain a polyamic acid solution.

Next, 25 g of acetic anhydride and 15 g of pyridine were added to the obtained solution, and the same procedure as in Synthetic Example 1 was then carried out to obtain a polyimide precursor having an imidization ratio of 85% and a logarithmic viscosity number of 0.46 dl/g.

Synthetic Example 5

The same equipment and procedure as in Synthetic Example 1 were used except that 500 g of diethylene glycol dimethyl ether was mixed with 41.40 g (0.129 mol) of BTDA, 34.89 g (0.043 mol) of ω,ω'-bis(3-aminopropyl)polydimethylsiloxane (molecular weight=814), 17.71 g (0,071 mol) of bis(3-aminophenyl)sulfone and 6.00 g (0.027 mol) of 3-aminopropyltriethoxysilane, to obtain a polyamic acid solution.

Next, 20 g of acetic anhydride and 15 g of pyridine were added to the obtained solution, and the same procedure as in Synthetic Example 1 was then carried out to obtain a polyimide precursor having an imidization ratio 43% and a logarithmic viscosity number of 0.50 dl/g.

Synthetic Example 6

The same equipment and procedure as in Synthetic Example 1 were used except that 500 g of NMP was mixed with 46.96 g (0.156 mol) of 3,3',4,4'-biphenyltetracarboxylic dianhydride, 37.51 g (0.091 mol) of 2,2-bis{4-(4-aminophenoxy)phenyl}propane, 4.93 g (0.046 mol) of m-phenylenediamine and 10.59 g (0.048 mol) of 3-aminopropyltriethoxysilane, to obtain a polyamic acid solution.

Next, 30 g of acetic anhydride and 15 g of pyridine were added to the obtained solution, and the same procedure as in Synthetic Example 1 was then carried out to obtain a polyimide precursor having an imidation ratio of 76% and a logarithmic viscosity number of 0.81 dl/g.

Comparative Synthetic Example 1

A polyamic acid solution synthesized in Synthetic Example 1 was directly used without carrying out any imidization reaction.

Comparative Synthetic Example 2

The same equipment and procedure as in Synthetic Example 1 were used except that 500 g of NMP was mixed with 42.06 g (0.130 mol) of BTDA and 26.12 g (0.130 mol) of bis(4-aminophenyl) ether, to obtain a polyamic acid solution.

The raw materials, the imidization ratios and the logarithmic viscosity numbers of the polyimide precursors synthesized in the synthetic examples and the comparative synthetic examples are all set forth in Table 1.

TABLE 1

| | Polyimide Precursors | | |
|---|---|---|---|
| | Tetracarboxylic Dianhydride (A mol) | Diamine (B mol) | Aminosilane (C mol) |
| Synthetic Example 1 | 0.158 | 0.079 | 0.157 |
| Synthetic Example 2 | 0.136 | 0.113 | 0.041 |
| Synthetic Example 3 | 0.105 | 0.094 | 0.021 |
| Synthetic Example 4 | 0.120 | 0.096 | 0.055 |
| Synthetic Example 5 | 0.129 | 0.043 0.071 | 0.027 |
| Synthetic Example 6 | 0.156 | 0.091 0.046 | 0.048 |
| Comp. Synthetic Example 1 | 0.158 | 0.079 | 0.157 |
| Comp. Synthetic Example 2 | 0.130 | 0.130 | 0 |

| | Relationship of A, B and C | | Imidization Ratio (%) | Logarithmic Viscosity Number (dl/g) |
|---|---|---|---|---|
| | C/(A − B) | C/(B + C) | | |
| Synthetic Example 1 | 2.0 | 0.66 | 82 | 0.26 |
| Synthetic Example 2 | 1.8 | 0.27 | 67 | 0.69 |
| Synthetic Example 3 | 1..9 | 0.18 | 94 | 1.3 |
| Synthetic Example 4 | 2.3 | 0.36 | 85 | 0.46 |
| Synthetic Example | 1.8 | 0.19 | 43 | 0.50 |

TABLE 1-continued

| | | | | |
|---|---|---|---|---|
| Example 5 Synthetic Example 6 | 2.5 | 0.26 | 76 | 0.81 |
| Comp. Synthetic Example 1 | 2.0 | 0.66 | 0 | 0.31 |
| Comp. Synthetic Example 2 | — | 0 | 0 | 2.3 |

In Comparative Synthetic Examples 1 and 2, the polyamic acid solutions which were not imidized were used.

EXAMPLE 1

(Preparation of a photosensitive polyimide precursor composition)

A polyimide precursor obtained in Synthetic Example 1 was dissolved in NMP to form a solution having a polymer concentration of 30%. Afterward, a photoacid generator (PAI-1) was added to the thus formed solution, the amount of the photoacid generator being 7 parts by weight based on 100 parts by weight of the polyimide precursor, to prepare a photosensitive polyimide precursor composition.

EXAMPLES 2 to 6

The same procedure as in Example 1 was carried out except that polyimide precursors and photoacid generators shown in Table 2 were used, to prepare photosensitive polyimide precursor compositions.

Comparative Examples 1 and 2

The same procedure as in Example 1 was carried out except that polyimide precursors shown in Table 2 were used, to prepare compositions.

Comparative Example 3

20 parts by weight of dimethylaminoethyl methacrylate and 5 parts by weight of Michler'ketone were added to 100 parts by weight of a solution obtained in Comparative Synthetic Example 2 to prepare a composition.

Each of the photosensitive polyimide precursor compositions obtained in these examples and comparative examples was spin-coated onto a silicon wafer, and it was then pre-baked at 90° C. for 3 minutes on a hot plate. At the time of the coating, a spinning speed was adjusted so that the thickness of a dried film might be about 3 μm. Next, the coating film was exposed for 40 seconds through a negative mask having a pattern for 10×10 μm perforations by a very high-pressure mercury lamp (9 mW/cm$^2$) (irradiation dose=360 mj/cm$^2$). After the exposure, the film was heated for 2 minutes on a hot plate at 120° C. (however, in Comparative Example 3, this heat treatment was omitted, because when such a heat treatment was made, development could not be carried). Next, the development was carried out with a mixed solution of 70 parts by weight of NMP and 30 parts by weight of isopropyl alcohol, rinsed with water, and then dried.

As a result, from the compositions of Examples 1 to 6 and Comparative Example 1, sharp patterns could be obtained, but as for the composition of Comparative Example 2, the pattern disappeared with development. With regard to the composition of Comparative Example 3, the pattern could barely be obtained by the prolonged exposure for 170 seconds (irradiation dose =1560 mj/cm$^2$). These films were post-baked at 150° C. for 30 minutes and successively at 400° C. for 1 hour. In all the films except the film of Comparative Example 2, the deformation of the patterns was not observed.

The reduction ratios of film thickness in a route from the pre-baking step to the post-baking step are shown in Table 2 in terms of percent. According to the results, it is apparent that the photosensitive polyimide precursor compositions of the present invention have the low reduction ratios of the film thickness.

TABLE 2

| | Photosensitive Polyimide Precursor Composition | |
|---|---|---|
| | Polyimide Precursor | Photoacid Generator |
| Example 1 | Synthetic Example 1 | PAI-1 |
| Example 2 | Synthetic Example 2 | PAI-2 |
| Example 3 | Synthetic Example 3 | PAI-3 |
| Example 4 | Synthetic Example 4 | PAI-4 |
| Example 5 | Synthetic Example 5 | PAI-5 |
| Example 6 | Synthetic Example 6 | PAI-1 |
| Comp. Example 1 | Comp. Synthetic Ex. 1 | PAI-1 |
| Comp. Example 2 | Comp. Synthetic Ex. 2 | PAI-1 |
| Comp. Example 3 | Comp. Synthetic Ex. 3 | None |

| | Patterned Polyimide Film | | |
|---|---|---|---|
| | Exposure Conditions Exposure Dose (mj/cm$^2$) | Reduction Ratio of Film Thickness (%) | Adhesive Properties (Number of peelded pieces) |
| Example 1 | 360 | 18 | 0 |
| Example 2 | 360 | 20 | 0 |
| Example 3 | 360 | 23 | 0 |
| Example 4 | 360 | 21 | 0 |
| Example 5 | 360 | 24 | 0 |
| Example 6 | 360 | 19 | 0 |
| Comparative Example 1 | 360 | 100 | 0 |
| Comparative Example 2 | 360 | 100 | 100 |
| Comparative Example 3 | 1530 | 52 | 100 |

The photoacid generators used PAI-1, 2, 3, 4 and 5 have chemical formulae (28), (29), (30), (31) and (32), respectively.

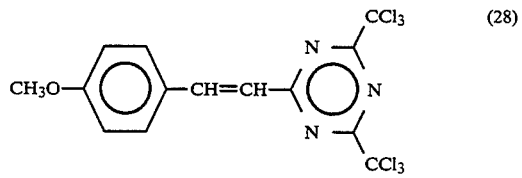

(28)

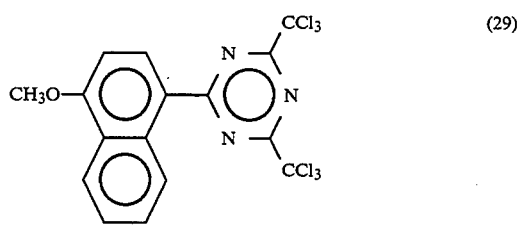

(29)

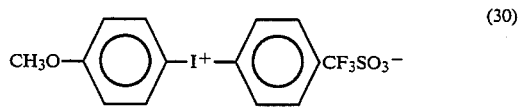

(30)

-continued

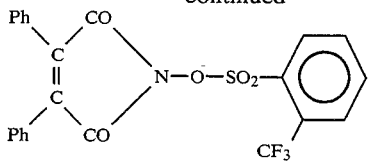
(31)

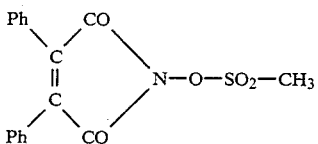
(32)

In order to inspect adhesive properties to a silicon wafer, coating and curing were carried out in accordance with the above-mentioned procedure except that patterning was not done, and the thus cured film was then cut so as to be sectioned into 100 small areas of a 2×2 mm square. Afterward, a cellophane adhesive tape was adhered on the surface of the cut film and then immediately peeled therefrom. The number of the sectioned areas from which the cured film had been peeled was counted to evaluate the adhesive properties. The results are shown in Table 2.

It is apparent from these results that the cured films obtained from the photosensitive polyimide precursor compositions of the present invention are excellent in adhesion to the silicon wafers.

After the respective photosensitive polyimide precursor compositions had been stored at room temperature for 3 months, patterning was carried out in like manner. As a result, from the compositions of Examples 1 to 6, sharp patterns could be obtained, but from the compositions of Comparative Examples 1 to 3, the patterns could not be obtained at all.

The present invention has the following effects.

The photosensitive polyimide precursor composition of the present invention not only has practical photosensitivity but also inhibits the reduction of film thickness due to curing and development, and the composition is also excellent in shelf stability in varnish and adhesion to a substrate such as a silicon wafer or the like. Thus, its practical effects are large.

What is claimed is:

1. A photosensitive polyimide precursor composition which comprises a polyimide precursor represented by the formula (6)

$$(OR^5)_k R^4{}_{3-k} Si-R^3-X-Z \quad (6)$$

and having a logarithmic viscosity number of 0.1 to 5.0 dl/g measured in N-methyl-2-pyrrolidone at 30° C. and a compound capable of generating an acid by light irradiation, said polyimide precursor being obtained by reacting A mol of a tetracarboxylic dianhydride represented by the formula (1)

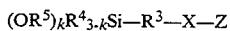
(1)

B mol of a diamine represented by the formula (2)

$$NH_2-R^2-NH_2 \quad (2)$$

and C mol of an aminosilane represented by the formula (3)

$$NH_2-R^3-SiR^4{}_{3-k}(OR^5)_k \quad (3)$$

so as to meet the relations of the equations (4) and (5)

$$1 \leq \frac{C}{A-B} \leq 2.5 \quad (4)$$

$$0.1 \leq \frac{C}{B+C} \leq 1 \quad (5)$$

wherein X is a polymer chain comprising m mol of a structural unit represented by the formula (6-1)

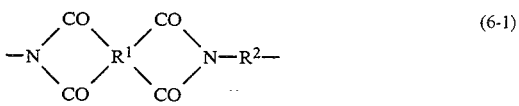
(6-1)

and n mol of a structural unit represented by the formula (6-2)

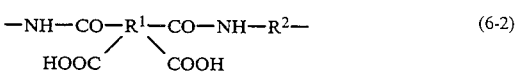
(6-2)

and meeting the relation of the equation (7)

$$40 \leq 100 \times \frac{m}{m+n} \leq 100 \quad (7)$$

Z is a group represented by the formula (8), (9), (10), (11), (12) or (13);

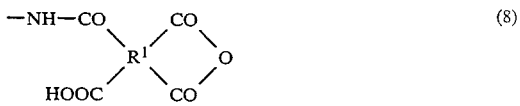
(8)

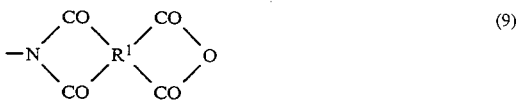
(9)

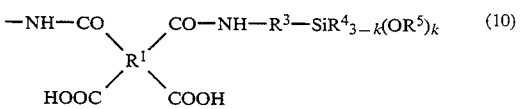
(10)

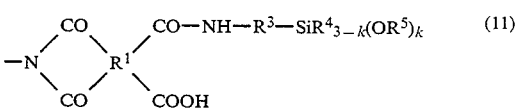
(11)

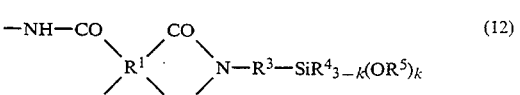
(12)

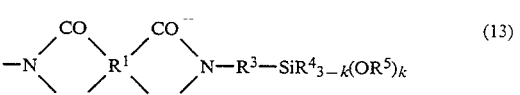
(13)

wherein $R^1$ is independently a tetravalent carbon cyclic aromatic group, heterocyclic group, alicyclic group or aliphatic group having 4 to 30 carbon atoms; $R^2$ is independently a divalent aliphatic group, alicyclic group, aromatic aliphatic group, carbon cyclic aromatic group or heterocyclic group having 2 to 30 carbon atoms, or a polysiloxane group represented by the formula (14)

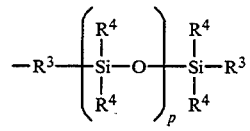
(14)

wherein p is a value of 1 to 100; R³ is independently a group represented by the formula (15), (16), (17) or (18)

$-\!\!+\!\mathrm{CH_2}\!\!\!+\!\!_s$ (15)

 (16)

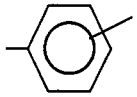 (17)

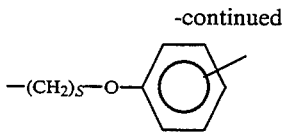 (18)

wherein s is an integer of 1 to 4; R⁴ is independently an alkyl group having 1 to 6 carbon atoms, phenyl group or alkyl-substituted phenyl group having 7 to 12 carbon atoms; and R⁵ is independently an alkyl group having 1 to 6 carbon atoms and k is 1 to 3.

2. A photosensitive polyimide precursor composition according to claim 1 wherein the value of $$\frac{C}{A-B}$$

in equation (4) is $$1.8 \leq \frac{C}{A-B} \leq 2.5.$$

* * * * *